Aug. 13, 1968 F. R. STEEL ET AL 3,397,367

TEMPERATURE COMPENSATED CRYSTAL OSCILLATOR

Filed Jan. 12, 1967

Inventors
FRANCIS R. STEEL
GEORGE R. GAWELL.

By Mueller, Aichele and Rauner
ATTYS.

3,397,367
Patented Aug. 13, 1968

3,397,367

TEMPERATURE COMPENSATED CRYSTAL OSCILLATOR

Francis R. Steel, Northbrook, Ill., and George R. Gawell, Indian Harbour Beach., Fla., assignors to Motorola, Inc., Franklin Park, Ill., a corporation of Illinois Filed Jan. 12, 1967, Ser. No. 608,864
7 Claims. (Cl. 331—116)

ABSTRACT OF THE DISCLOSURE

A temperature compensated crystal oscillator using a voltage variable reactance device coupled to the crystal to regulate the frequency of the oscillator in response to a control voltage. The control voltage is developed by a temperature sensing element and the curve of the control voltage is shaped by a non-linear network.

*Background of the invention*

Figure 1:
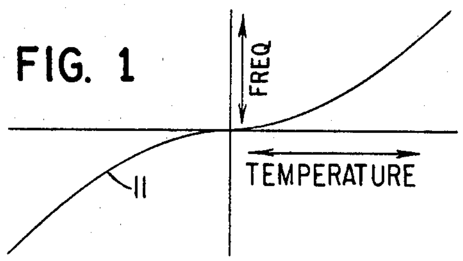

The crystals used to control the output frequency of crystal oscillators have resonant frequencies which vary with temperature. When it is desired to control the output frequency of an oscillator to a high degree of accuracy, for example 2 parts in $10^7$, means must be provided for regulating the resonant frequency of the frequency of the frequency determining circuits used in the oscillator. Where the frequency determining element is a crystal it is stabilized by enclosing it within an oven which maintains the ambient temperature at a constant level. Precise crystal ovens are relatively complex devices and use costly circuit elements. In addition the ovens consume large amounts of power, an undesirable feature in miniaturized semiconductor circuits where it is desirable to reduce power requirements to as low a value as possible. Furthermore, crystal ovens have undesirable warmup time delays. Existing temperature compensated crystal oscillators are difficult to adjust because of the complex relation between resistor values and compensation curve.

*Summary*

Accordingly, it is an object of this invention to provide an improved temperature compensated crystal oscillator.

Another object of this invention is to provide a temperature compensated crystal oscillator with the frequency of the oscillator being controlled to a high degree of accuracy without the use of crystal ovens.

Another object of this invention is to provide a temperature compensated crystal oscillator wherein the temperature compensation is adjustably controlled in a simple manner.

In practicing this invention a crystal oscillator is provided having a voltage variable capacitor coupled to the crystal. A control voltage applied to the voltage variable capacitor acts to change the resonant frequency of the oscillator. A temperature sensing element is provided for measuring the temperature of the crystal and producing a control voltage in response thereto. A circuit including a non-linear network couples the temperature sensing element to the voltage variable capacitor. The non-linear network comprises a plurality of series connected Zener diodes and first resistors connected to a second resistor forming a voltage divider. The Zener diodes are selected to break down at different voltages so that the voltage divider acts in a non-linear manner to shape the curve of the control voltage applied to the voltage variable capacitor. A pair of temperature sensing elements can be used to provide a more easily shaped control voltage curve. The first resistors can be made adjustable so that the control voltage curve can be changed to produce the best results.

Figure 2:
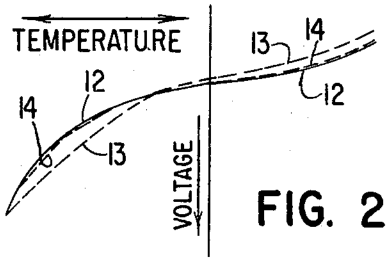
Figures 3, 4:
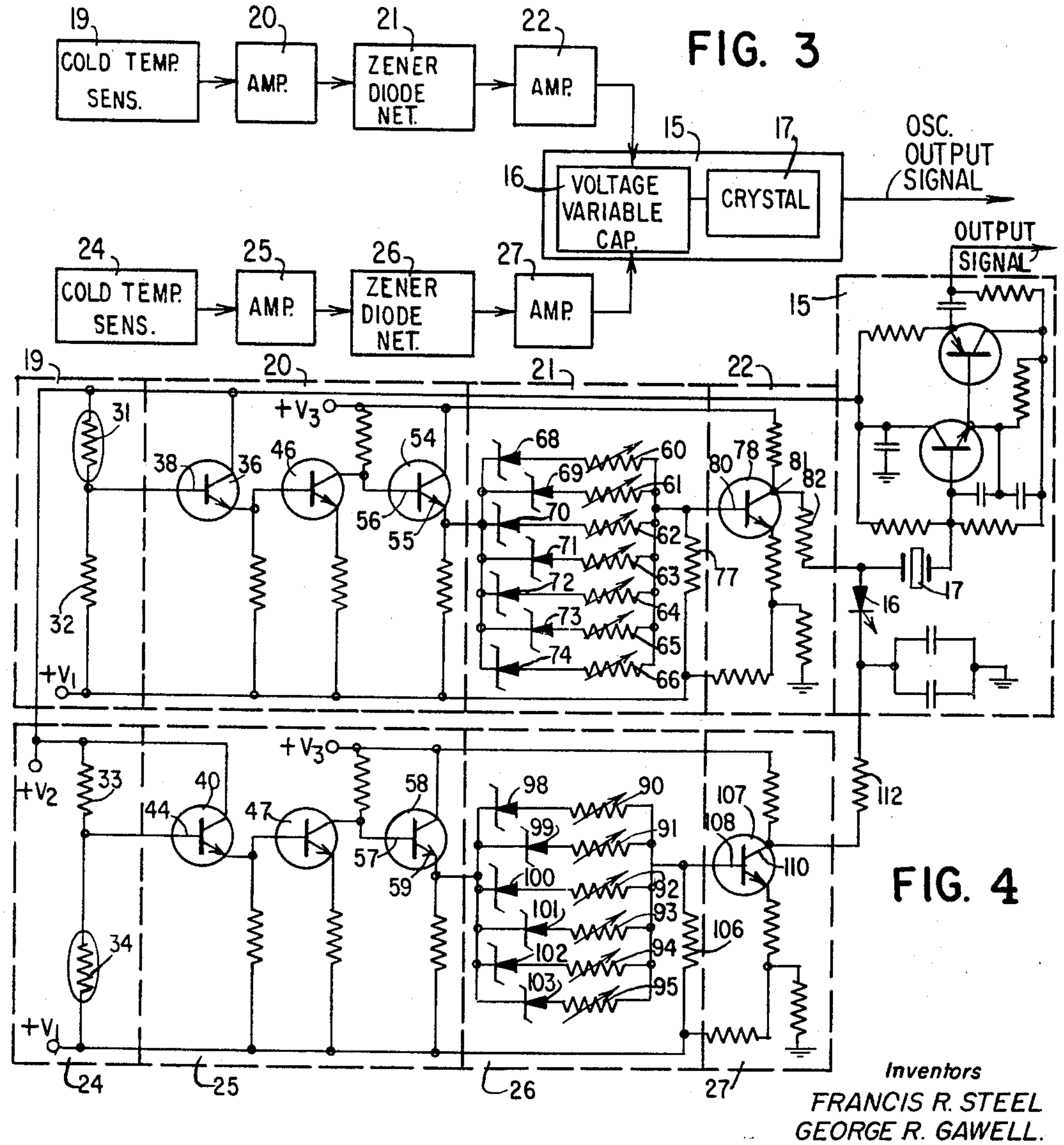

The invention is illustrated in the drawings of which:

FIG. 1 is a curve showing the variation of crystal frequency with temperature;

FIG. 2 includes curves showing the control voltage required to be applied to a voltage variable capacitor to offset the frequency changes shown in FIG. 1 and the control voltages obtainable from the circuit of the invention;

FIG. 3 is a block diagram of a circuit incorporating features of this invention; and FIG. 4 is a schematic of the circuit shown in FIG. 3.

*Description*

Referring to FIG. 1 there is shown a curve 11 of frequency versus temperature for an uncompensated crystal which must operate over a wide temperature range in equipment requiring a high degree of frequency stability. The frequency change shown in FIG. 1 is greater than can be permitted in many types of equipment. As shown in FIG. 4, a voltage variable capacitor 16 may be coupled to crystal 17 of crystal oscillator 15 to change the resonant frequency of the crystal in order to minimize the frequency deviation of the oscillator because of temperature changes of the crystal.

In FIG. 2 curve 12 shows the shape of the curve of voltage required across the voltage variable capacitor 16 to compensate for crystal frequency changes due to changes in temperature. The exact shape of this curve will vary depending upon the particular crystal and voltage variable capacitor used. The voltage output of a thermistor and resistor network, which may be used to sense the temperature of the crystal, does not have the same curve of voltage versus temperature as that required by the voltage variable capacitor. The curve of control voltage from the temperature sensing elements 31 and 33 of FIG. 4 is shown as curve 13 of FIG. 2. Curve 13 has been adjusted to show the voltage applied to the voltage variable capacitor 16 without the correction supplied by the non-linear network. While the voltage shown in curve 13 will supply some correction, it will not provide sufficient compensation for a highly stable oscillator requirement. To provide more accurate control the voltage curve 13 may be adjusted by varying it in a non-linear manner. This can be done by using a non-linear network coupling the temperature sensing elements to the voltage variable capacitor. The curve 13 may be adjusted in a piecewise manner to more nearly approximate curve 12. The adjusted curve is shown as curve 14. By increasing the number of sections in curve 14 the curve can be made to approximate curve 12 as closely as desired.

Referring to FIG. 3, there is shown a block diagram of a circuit for shaping the curve of control voltage applied to voltage variable capacitor 16. In FIG. 3 separate sensing elements 19 and 24 are used, one to sense the lower temperature range and the other to sense the higher temperature range to which the crystal may be subjected. It is particularly advantageous to use more than one sensor when the temperature varies over a large range, however, good results can be obtained using a single temperature sensor.

Temperature sensing devices 19 and 24 sense the temperature of the crystal 17 and develop control voltages which are a function of the temperature. These control voltages are amplified in voltage amplifiers 20 and 25 and applied to non-linear networks 21 and 26. Non-linear networks 21 and 26 shape the curve of control voltage as desired and apply the control voltages to amplifiers 22 and 27 respectively. The control voltages from amplifiers 22 and 27 are applied to opposite sides of the voltage variable capacitor 16 to adjust the frequency of oscillator 15.

In FIG. 4 there is shown a schematic of the circuit of FIG. 3. In the schematic of FIG. 4 regulated voltages $V_1<V_2<V_3$ are applied to the circuit as shown. A thermister 31 is connected in series with resistor 32 between voltages $V_1$ and $V_2$ to provide a voltage divider input to base 38 of transistor 36. Thermistor 31 is positioned as close to the crystal 17 as possible to measure the temperature of the crystal. As the temperature increases the resistance of thermistor 31 decreases causing the voltage appearing on base 38 to increase.

A similar voltage divider circuit consisting of resistor 33 and thermistor 34 is coupled to base 41 of transistor 40. The positions of resistors 33 and thermistor 34 are reversed from the positions of thermistor 31 and resistor 32, thus a decrease in the temperature of the crystal causes a decrease in the voltage applied to base 41 of transistor 40. Transistors 36 and 40 are connected as emitter followers and the output voltages are coupled to transistors 46 and 47 respectively. Transistors 46 and 47 are connected as voltage amplifiers to provide a greater swing in control voltage and thus a better corrective action. The output voltage of voltage amplifiers 46 and 47 is reversed in phase from the voltages appearing at the output of the temperature sensing elements. The output from voltage amplifiers 46 and 47 are coupled to base 56 of transistor 54 and base 57 of transistor 58 respectively.

The output of transistor 54 is coupled from emitter 55 to base 80 of transistor 78 through a non-linear network comprised of first resistors 60 to 66, second resistor 77 and Zener diodes 68 to 74. Transistor 78 is connected as a voltage amplifier and reverses the polarity of the input voltage. The output voltage of transistor 78 is coupled from collector 81 to one side of varicap 16 through resistor 82.

The output of transistor 58 is coupled from emitter 59 to base 108 of transistor 107 through a non-linear network comprised of first resistors 90 to 95, second resistor 106 and Zener diodes 98 to 103. Transistor 107, connected as a voltage amplifier reverses the polarity of the voltage appearing on base 108. The output voltage on collector 110 is coupled to varicap 16 through resistor 112.

The non-linear network comprised of resistors 60 to 66, Zener diodes 68 to 74 and resistor 77 is in the form of a voltage divider. The resistance of one portion of the voltage divider, resistor 77, is fixed in value while the resistance of the other portion varies in a non-linear manner. With the voltage across the voltage divider at a low value assume that only Zener diode 68 conducts. Thus the voltage divider would consist only of resistors 60 and 77. Resistor 60 is adjustable to select the desired voltage level at base 80 of transistor 78. In this manner a portion of the curve of the control voltage is adjusted. As the control voltage changes the voltage appearing across the voltage divider increases to a value where Zener diode 69 conducts thus coupling resistors 60 and 61 in parallel as one portion of the voltage divider. Resistor 61 can now be adjusted to change the curve of the control voltage as desired for the second portion of the curve of the control voltage. It should be noted that the adjustments to resistor 61 will not affect the portion of the curve controlled by resistor 60 since Zener diode 69 will not be conducting when the control voltage is in the first region. As the control voltage increases additional Zener diodes conduct adding additional resistances in parallel so that the shape of the curve of control voltage is changed. Each resistor can be made adjustable so that the curve can be shaped as desired. The voltage divider circuit consisting of resistors 90 to 95, Zener diodes 98 to 103 and resistors 106 operates in the same manner. While the curve of FIG. 2 is shown divided into seven portions, it is not limited to this division and can be divided into any number of portions desired. In the circuit shown in FIG. 4 thirteen divisions are used. While a schematic has been shown using Zener diodes it is not limited to this construction and any form of diode can be used. Also any other form of non-linear network can be used in place of the voltage divider network shown.

Typical values of the components used in the non-linear networks shown in the schematic of FIG. 4 may be as follows:

| | | |
|---|---|---|
| Diode **68** | v | 5.1 |
| Diode **69** | v | 5.6 |
| Diode **70** | v | 6.2 |
| Diode **71** | v | 7.5 |
| Diode **72** | v | 9.1 |
| Diode **73** | v | 10 |
| Diode **74** | v | 11 |
| Diode **98** | v | 5.1 |
| Diode **99** | v | 5.6 |
| Diode **100** | v | 6.2 |
| Diode **101** | v | 6.8 |
| Diode **102** | v | 7.5 |
| Diode **103** | v | 8.2 |
| Resistor **60** | ohms | 47K |
| Resistor **61** | do | 33K |
| Resistor **62** | do | 10K |
| Resistor **63** | do | 22K |
| Resistor **64** | do | 10K |
| Resistor **65** | do | 15K |
| Resistor **66** | do | 15K |
| Resistor **77** | do | 1K |
| Resistor **90** | do | 18K |
| Resistor **91** | do | 12K |
| Resistor **92** | do | 15K |
| Resistor **93** | do | 12K |
| Resistor **94** | do | 3.6K |
| Resistor **95** | do | 1.8K |
| Resistor **96** | do | 1K |

Values of the other components used in the circuit may be:

| | | |
|---|---|---|
| Transistors **36, 40, 46, 47, 54, 58, 78** and **107** | | 2N706 |
| Thermistor **31** | ohms | 1.5K |
| Thermistor **34** | do | 55.3K |
| Resistor **32** | do | 18K |
| Resistor **33** | do | 10K |

We claim:

1. A temperature compensated oscillator having a frequency determining crystal, including in combination, voltage variable reactance means coupled to the crystal, temperature sensing means positioned to measure the temperature of the crystal and being responsive thereto to develop a control voltage, circuit means coupling said temperature sensing means to said voltage variable reactance device for applying said control voltage thereto whereby the frequency of the oscillator is regulated, said circuit means including a plurality of series connected Zener diodes and first resistors each coupled to a second resistor to provide a non-linear voltage divider circuit, said Zener diodes being selected to breakdown at different voltage levels whereby the shape of the curve of said control voltage is varied in a non-linear manner and the frequency of the oscillator is maintained at a substantially constant value.

2. The temperature compensated oscillator of claim 1 wherein said temperature sensing means includes thermistor means nad resistance means coupled to form a voltage divider with said thermistor means being positioned to measure the temperature of the crystal.

3. The temperature compensated oscillator of claim 5 wherein each of said plurality of first resistors is adjustable whereby the shape of the curve of said control voltage may be adjusted as required to maintain the frequency of the oscillator at a relatively constant value.

4. A temperature compensated crystal oscillator having a frequency determining crystal, including in combination, voltage variable capacitance means coupled to the crystal, first and second temperature sensing means positioned to measure the temperature of the crystal and being responsive thereto to develop first and second control voltages respectively, first and second amplifier means coupling said first and second temperature sensing means respectively to said voltage variable capacitor for applying said first and second control voltages thereto whereby the frequency of the oscillator is regulated, said first and second amplifier means including first and second non-linear network means respectively for shaping the curves of said first and second control voltages whereby the frequency of the oscillator is maintained at a desired value.

5. The temperature compensated oscillator of claim 7 wherein said first non-linear network includes a plurality of series connected diodes and first resistors each coupled to a second resistor to provide a non-linear voltage divider circuit and said second non-linear network includes a plurality of series connected diodes and third resistors each coupled to a fourth resistor to provide a non-linear voltage divider circuit.

6. The temperature compensated oscillator of claim 8 wherein each of said diodes are Zener diodes selected to conduct at different voltages whereby the shape of the curves of said first and second control voltages is varied in a non-linear manner.

7. The temperature compensated oscillator of claim 9 wherein said first temperature sensing means includes first thermistor means coupled to a first voltage, fifth resistance means coupling said first thermistor to a second voltage to form a voltage divider, said second temperature sensing means includes second thermistor means coupled to said second voltage, sixth resistance means coupling said second thermistor means to said first voltage to form voltage divider, said first and second thermistors being positioned to measure the temperature of the crystal.

References Cited

UNITED STATES PATENTS

| | | | |
|---|---|---|---|
| 3,054,966 | 9/1962 | Etherington | 331—158 |
| 3,176,244 | 3/1965 | Newell et al. | 331—116 |

JOHN KOMINSKI, *Primary Examiner.*